United States Patent [19]

Geiger et al.

[11] 4,026,505

[45] May 31, 1977

[54] VARIABLE HIGH PASS COUPLER

[75] Inventors: Willard L. Geiger, Chagrin Falls; John D. Williams, Burton, both of Ohio

[73] Assignee: Harmon Industries, Inc., Grain Valley, Mo.

[22] Filed: Jan. 15, 1976

[21] Appl. No.: 649,502

[52] U.S. Cl. .............................. 246/34 R; 246/128
[51] Int. Cl.² ........................................ B61L 21/06
[58] Field of Search .......... 246/34 R, 34 A, 34 CT, 246/128, 130, 40, 57, 48, 75, 179

[56] References Cited

UNITED STATES PATENTS

| | | | |
|---|---|---|---|
| 2,605,390 | 7/1952 | Judge | 246/34 R |
| 3,025,393 | 3/1962 | Crain | 246/34 R |
| 3,268,723 | 8/1966 | Failor | 246/34 R |

*Primary Examiner*—Trygve M. Blix
*Assistant Examiner*—Reinhard J. Eisenzopf
*Attorney, Agent, or Firm*—D. A. N. Chase

[57] ABSTRACT

A high pass coupler or filter network provides a bypass for relatively high frequency AC signals, while providing DC signal isolation and avoiding loading the track for relatively low frequency AC signals, around a set of insulated joints in a railroad track or the like. The high pass coupler includes a coupling portion for connection to a track and a dynamically resonant filtering portion with a selectable low cut off frequency determined by the proper size capacitor. The capacitor sets up resonance with the track inductance, which decreases in magnitude in response to the moving shunt affect of a train approaching the coupling portion and thus increases the resonant frequency of the coupler, and the capacitor is of a magnitude that ensures the coupler resonant frequency will not exceed the frequency of the AC signals normally to be passed by the coupler. Moreover, in the high pass coupler, losses may be introduced, for example, by a potentiometer to present to the coupled AC signals and particularly to the system employing the same an impedance characteristic at least approximately equivalent to the normal track impedance characteristic presented thereto if the track were electrically continuous.

20 Claims, 2 Drawing Figures

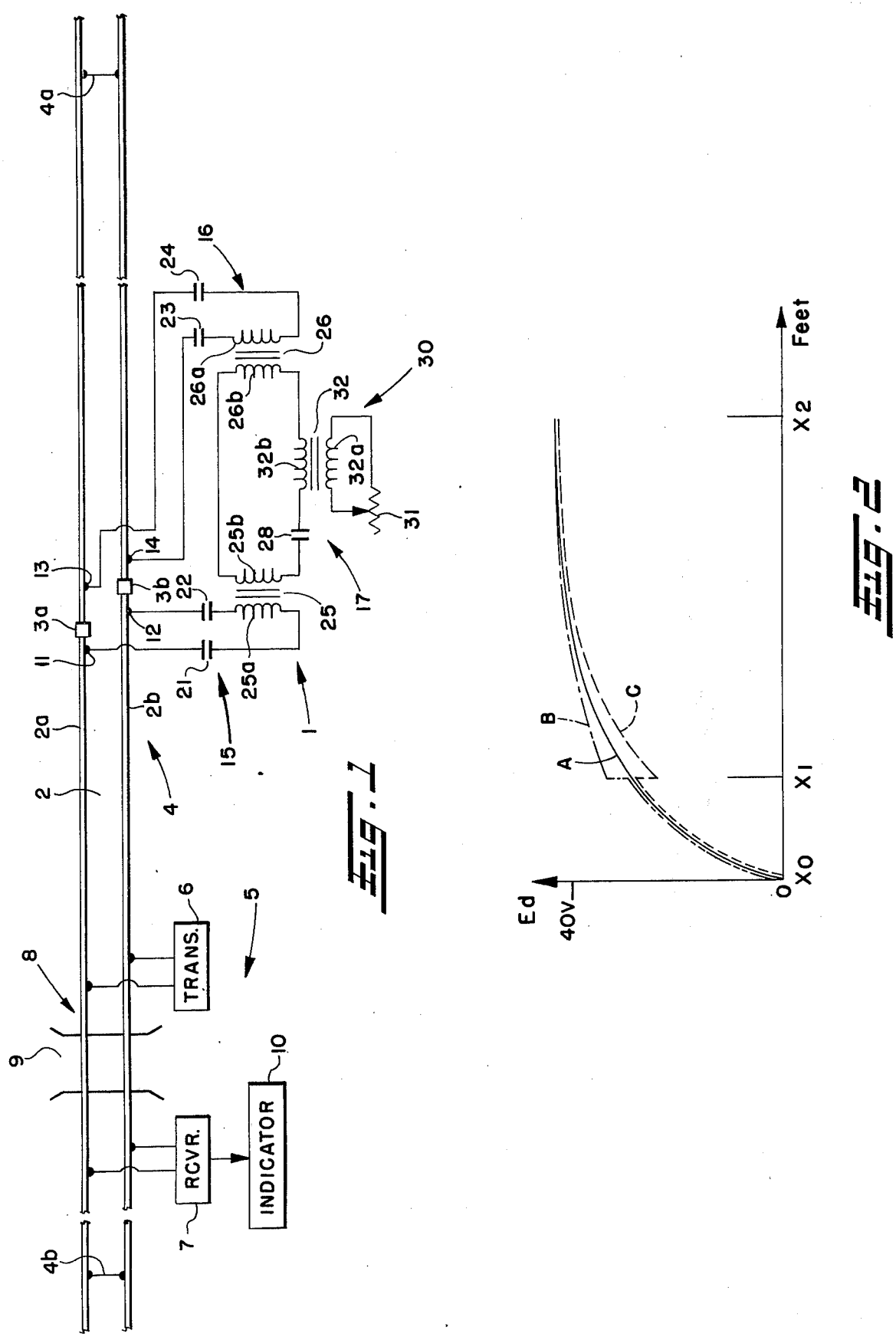

VARIABLE HIGH PASS COUPLER

BACKGROUND OF THE INVENTION

This invention is related to save filters, and, more particularly, this invention is related to a high pass filter network or coupler tuned to create a desired resonance with a railroad track for coupling AC signals above a predetermined frequency around a set of insulated joints.

The high pass coupler of the invention has particular utility when used in conjunction with train detection equipment that operates with a relatively high frequency AC electric signal, for example in the frequency range of 100 to 3000 Hz, such as the detector system disclosed in U.S. Pat. No. 3,850,390, issued on Nov. 26, 1974. Such a detector system transmits an AC signal in a monitored railroad track, and the presence and/or the approach of a train on such monitored track will act as a shunt to attenuate the AC signal in a manner such that the train will be safely detected by the system. Upon detecting a train, such detector system may operate a typical signal relay to drop gates or to energize signal lights at a grade crossing or may provide a control to block signal systems, etc.

The relatively high frequency signals employed in such detector systems may not be the only electric signals in a given section or length of railroad track. In fact, it is common to find DC signals and/or relatively low frequency AC signals, say at 60 Hz, commonly used for code signaling, in the track from other equipment coupled thereto. Moreover, it is also common to use insulated joints in the railroad track to prevent transmission of electric signals from one section of track to another.

In the past tuned shunts, including a series connected capacitor and inductor, respectively coupled across each of the insulated joints in a set of joints or broad band shunts, including respective capacitors coupled across each of the insulated joints, have been used for coupling desired AC signals around insulated joints in a railroad track, but each of these shunts usually also coupled too much impedance into the track circuit, which is undesirable, especially when the track is to carry signals from movement detector systems. Also, capacitor broad band shunts still may pass certain AC signals as well as spikes or other signal noise on the track.

To signal systems coupled to a railroad track or the like, such as the signal system disclosed in the mentioned patent, the lumped impedance characteristic of the track in a monitored approach, for example, to an island at a grade crossing will vary generally logarithmically with respect to distance as viewed from the island to a beginning of approach shunt, say 3000 feet down the track. For proper operation it is desirable that the detector system monitoring the approach see such a normal lumped track impedance characteristic over the entire monitored approach, track section or the like.

SUMMARY OF THE INVENTION

The high pass coupler of the invention may be used to couple the relatively high frequency signals, for example, above 100 Hz, of railrod signal detector systems, such as the system disclosed in the mentioned patent, around insulated joints in a monitored track in a manner such that to the detector system the lumped impedance characteristic of the monitored track looks normal as though the track were electrically continuous. It will be appreciated, however that the high pass coupler of the invention may be employed to pass signals from other railroad signal equipment around insulated joints in a railroad track or to pass signals in other signal transmission media around open circuits therein. Moreover while the invention is illustrated and described herein with respect to a high pass filter or coupler, it is contemplated that the principles of the invention may be employed with other filter networks or the like.

In the high pass coupler of the invention resonance is set up with the inductance of a track section monitored, for example, by a detector system to effect a resonant amplification of the track signal to be passed around insulated joints. That resonant amplification will cause the effective track length between the insulated joints and the beginning of approach shunt to look to the detector system shorter than the actual length; therefore, the high pass coupler is provided with means to reduce its quality or efficiency factor Q so that to such signal equipment the monitored track section or approach, including the insulated joints and the high pass coupler, will appear as though the track were actually electrically continuous and actual length.

Thus, the high pass coupler of the invention is a high pass filter network with a DC signal isolating or blocking portion, a relatively low frequency AC signal filtering or blocking portion, and a resonating portion. The filter network employs transformer coupling providing effective track impedance matching, low frequency filtering, and an impedance step up characteristic enabling the utilization of a relatively small capacitor in its resonating portion. That capacitor resonates with the track inductance, which decreases in response to an approaching train, for example, causing a corresponding increase in the resonant frequency of the high pass coupler; and the capacitor size is chosen such that at a minimum track inductance the resonant frequency will not exceed the frequency of the track signal to be passed by the coupler. Moreover, to reduce the Q of the coupler an impedance member, such as a variable resistance, preferably is transformer coupled into the network in the AC filtering portion, such transformer coupling providing increased ruggedness of the coupler, for example, to avoid damage to the resistance from lightening-created voltage spikes or the like. When the coupler is properly detuned by the variable resistance, the resonating capacitor will resonate with the track to the extent that the impedance characeristic actually presented the detector system will approach or equal the actual track impedance characteristic when it is electrically continuous without any insulated joint interruptions.

With the foregoing in mind, a primary object of the invention is to couple the electric signals of a predetermined frequency range, and, preferably, above a predetermined frequency, around insulators or other open circuits in a railroad track or the like, and, more particularly, to effect such coupling while presenting to the coupled signals and/or to the equipment transmitting and/or receiving them an impedance characteristic at least approximately equivalent to the track impedance characteristic presented were the track electrically continuous.

Another object of the invention is to provide adjustable coupling in a filtering network or circuit.

A further object of the invention is to enable a railroad signal detector system or the like to look effectively through insulated joints in a railroad track to detect a train and, more particularly, to enable a movement detector system properly to detect the motion of an approaching train located beyond a set of insulated joints in a railroad track.

An additional object of the invention is to couple electric signals of a predetermined frequency range around insulated joints in a railroad track or the like while blocking those signals intended normally to be blocked by such insulated joints; and, more particularly, to obtain such coupling relatively efficiently without excessive attenuation of the signals to be passed and with the ability to match impedance so that the track length monitored by AC signal equipment coupled thereto appears electrically continuous.

These and other objects and advantages of the present invention will become more apparent as the following description proceeds.

To the accomplishment of the foregoing and related ends, the invention, then, comprises the features hereinafter fully described and particularly pointed out in the claims, the following description and the annexed drawing setting forth in detail a certain illustrative embodiment of the invention, this being indicative, however, of but one of the various ways in which the principles of the invention may be employed.

BRIEF DESCRIPTION OF THE DRAWING

In the annexed drawing:

FIG. 1 is a schematic electric circuit diagram of the high pass coupler of the invention used to bypass a set of insulated joints located in a section of track monitored by a railroad signal detector system; and FIG. 2 is a graphical representation of a control signal developed in the receiver of the railroad signal detector system of FIG. 1 depicting the voltage of that signal with respect to the distance of a track shunt, such as the wheels and axle of a train, from the island at a grade crossing, such graphical representation, therefore, being representative of the lumped track impedance characteristic with respect to distance of such a track shunt as viewed in one direction from the island.

DESCRIPTION OF THE PREFERRED EMBODIMENT

Referring now more specifically to the drawing and initially to FIG. 1, the high pass coupler of the invention is generally indicated at 1 connected to the two parallel rails 2a, 2b of the railroad track 2 in which a set of insulated joints 3a, 3b are respectively located. The insulated joints 3a, 3b are in a section 4 of track monitored by a railroad signal detector system 5, which includes a transmitter 6 and a receiver 7 that define between their tie points to the track an island 8 at a typical railroad grade crossing 9. The insulated joints 3a, 3b may be provided in the track, for example, to block DC signals, DC code signals, 60 Hz code signals or the like.

For convenience in describing the invention, the detector system 5 may be considered to be the detector system disclosed in the mentioned U.S. Pat. No. 3,850,390, although this consideration is, of course, for exemplary purposes only, and it will be understood that the coupler 1 may be employed to pass AC signals used in other transmission systems for railroad signaling or for other purposes. The transmitter 6 transmits in the track a pulse modulated AC carrier wave track signal, for example, at about 300 Hz, and the receiver 7 receives the track signal and in response to the characteristics thereof, which will vary as the lumped impedance of the monitored track varies in response changing ballast conditions, the moving shunt affect of a train, or the like, will operate a warning device 10 at the grade crossing 9 to indicate whether or not a train is approaching the crossing in order to avoid accidents. Therefore, it is a primary function of the high pass coupler 1 to couple the pulse modulated AC carrier wave signal from the transmitter 6 around the insulated joints 3a, 3b in a manner such that the system 5 will not be aware of the insulated joints or of the high pass coupler. More specificially, when the coupler 1 is properly adjusted, as will be described further below, the track impedance characteristic seen by the system 5 will be though the track were electrically continuous so that the receiver 7 can accurately detect a train in the monitored track section 4 even beyond the insulated joints 3a, 3b approaching the grade crossing 9 from the right, as shown in the drawing, in response to the train approach speed and distance from the island 8.

As disclosed in U.S. Pat. No. 3,850,390, the transmitter 6 transmits its track signal in one or both directions from the island 8 along the entire track section or approach 4, which may be terminated at one or both ends by respective beginning of approach shunts 4a, 4b. For convenience, reference to the approach 4 below indicates only the monitored approach to the right of the island 8 between the transmitter tie points to the track and the shunt 4a. The receiver 7 responds to only the track signal of the frequency transmitted by the transmitter 6, and both the transmitter 6 and the receiver 7 preferably are adjusted so that when no insulated joints appear in the monitored track section a control signal, referred to hereinafter as the $E_d$ signal, is developed in the receiver 7 at a 40 volt DC level with a proportional 2.5 volt peak-to-peak AC pulse impressed thereon, assuming no train is located in the approach 4. The leading wheels and axle of a train approaching the island 8 from the right act as a moving shunt upon crossing the beginning of approach shunt 4a reducing the lumped track impedance seen by the system 5 and therefore causing a logarithmic drop in the $E_d$ voltage and the proportional pulse impressed thereon with respect to the distance of the train from the island. Then responding to the $E_d$ signal and changes therein, the receiver 7 normally will produce an output causing a conventional signal relay to drop a crossing gate, to energize a warning light or the like at a time suitable in advance of an approaching train's arrival at the crossing 9, for example, in the manner disclosed in the mentioned patent.

Turning now to FIG. 2 of the drawings the solid line curve A represents the DC part of the $E_d$ voltage developed in the receiver 7 with respect to the distance of a train or other track shunt from the island 8. Thus, the curve A also is proportional to the lumped track impedance over the approach 4 with respect to distance as viewed from the island 8, assuming that the track were electrically continuous from the island 8 to the beginning of approach shunt 4a, i.e. without any insulated joints or high pass coupler therein. The $E_d$ voltage depicted in FIG. 2 is 40 volts when no train is located in the approach 4 or when a train is located just at the beginning of approach shunt 4a, which is represented at distance $X_2$ on the graph of FIG. 2, say 3000 feet from the island 8, which is represented at distance $X_0$ on the graph. Following the curve A in FIG. 2 from distance $X_2$ toward the distance $X_0$, it will be seen that the $E_d$ voltage and thus the effective lumped track impedance will drop logarithmically as a train shunting the track rails nears the island. Moreover, when the leading train wheels reach the transmitter 6 tie point to the track 2 at the beginning of the island 8, i.e. at distance $X_0$, the $E_d$ voltage will be zero, as the entire track signal then will be shunted as long as any part of the train is in the island 8.

The curves B and C in FIG. 2 represent the $E_d$ voltage or the lumped track impedance with respect to distance as viewed from the island 8 when the efficiency or quality factor Q of the high pass coupler 1 at the insulated joints 3a, 3b, represented at distance $X_1$ on the graph, say five hundred feet from the island 8, is improperly adjusted, as will be described in more detail below. Curve B results when the Q is too low causing too large a lump of impedance at the joints 3a, 3b and in effect increasing the apparent length of the track between the joints and the beginning of approach shunt 4a, as seen by the system 5, for example. A similar stepped curve shape would be experienced when prior art couplers are used to pass relatively high frequency signals around a set of insulated joints in a track. Curve C results when the Q is too high causing an over-coupling effect due to resonance between the coupler 1 and the track, which reduces the apparent distance between the joints and the shunt 4a, as viewed by the detector system 5 at the island 8. If the $E_d$ voltage with respct to distance follows curve B instead of curve A, a rapidly approaching train might not cause a sufficient rate of $E_d$ voltage drop to cause the detector 7 to detect the train until the train would reach the insulated joints. On the other hand, if curve C were followed, a slowly approaching train might be detected by the receiver 7 too soon before arrival of the train at the crossing 9, therefore causing unnecessary down time of the indicator 10. Moreover, if curve C were followed, when the rear wheels of a train leaving the island pass the insulated joints, the substantially instantaneous drop in $E_d$ voltage may cause the receiver 7 falsely to produce an output indicative of an approaching train, which would be an unnecessary nuisance at the crossing 9.

Referring back again to FIG. 1, the high pass coupler 1 has two pairs of coupling terminals 11 through 14 for connecting the same to the track, and the high pass filter network will effectively pass AC signals above is cut-off frequency between its terminal pairs with a minimum of attenuation and usually with a degree of resonant amplification. For convenience of description, the terminals 11, 12 may be designated input terminals and the terminals 13, 14 output terminals; however, the coupler 1 preferably is substantially symmetrical so that the terminals 13, 14 may be considered the coupler input terminals when the signal to be passed by the coupler originates from the right with reference to the connections shown in FIG. 1, for example. Accordingly, the coupler 1 may be considered to have interchangeable input and output coupling portions 15, 16 for connecting the same to a track or other transmission medium having insulated joints or other open circuit means therein and an intermediate portion 17 for providing the AC filtering and/or resonant amplification functions of the coupler.

A pair of capacitors 21, 22 are connected in the input coupling portion 15 and a further pair of capacitors 23, 24 are connected in the output coupling portion 16. The capacitors 21 through 24 are sufficiently large, for example, of approximately 5000 or more microfarads each and preferably of the elecrolytic type to provide DC isolation without loading the track for other AC signals, such as 60 Hz code or the like. Thus, those capacitors permit the coupler 1 to be connected to the track rails 2a, 2b in the manner shown in FIG. 1 with the input and output portions directly across the rails on opposite sides of the joints 3a, 3b without short circuiting ay DC signals in the track.

The respective input and output coupling portions 15, 16 are inductively coupled to the intermediate portion 17 by respective preferably identical impedance matching transformers 25, 26, each of which has a relatively low impedance winding 25a, 26a, for example, of approximately 2 ohms respectively coupled in the input and output portions 15, 16, and a relatively high impedance windings 25b, 26b, for example, of about 600 ohms coupled in a series circuit loop in the intermediate portion 17. In a preferred form of the invention the low impedance windings approximately match the track impedance, and the turns ratio in each of the transformers preferably is on the order of approximately 1 to 20 so that an input signal to the high pass coupler 1 is stepped up, for example, by the transformer 25, upon being transmitted into the intermediate portion 17 and the signal passed by the latter is stepped down by the transformer 26 for application to the track. Moreover, preferably each of the transformers 25, 26 has a natural low frequency cut-off point that is above the 60 Hz level so as to avoid transmitting 60 Hz signals into the intermediate filtering portion 17, and in one preferred embodiment of the invention the low frequency cut-off of the transformers 25, 26 is approximately 85 Hz.

In the intermediate portion 17 a capacitor 28 is coupled in the series circuit loop between the two high impedance windings 25b, 26b. The capacitor 28 is intended to resonate with the inductance of the track portion, i.e. the approach 4, to which the coupler 1 is connected, and the size of the capacitor 28 and the magnitude of the track inductance will establish a resonant frequency for the coupler 1. Due to the step up characteristic of the transformers 25, 26 the track inductance seen by the capacitor 28 is enlarged from the actual track inductance by the square of the transformer turns ratio, and therefore, the size of the capacitor 28 may be relatively small, for example, on the order of from about 2 microfarads to about 20 microfarads, while being effective to resonate with the track inductance at a resonant frequency below the track signal frequency, i.e. the operating frequency of the detector system 5.

In the preferred embodiment of the invention it is the function of the high pass coupler 1 to make the track section or approach 4 look electrically continuous to the detector system 5 even though the track actually is interrupted by the insulated joints 3a, 3b. Therefore, for an understanding of the operation of the high pass coupler 1 it may be assumed that the capacitor 28 sets up resonance with the inductance of the track over the length of the approach 4, and the coupler resonant frequency, i.e. of the series circuit including the capacitor 28 in series connection via the transformers 25, 26 with the track inductance, normally will be well below the detector system operating frequency. The resonant frequency $f_0$ may be determined according to the following equation:

$$f_0 = \frac{1}{2\pi \sqrt{LC}},$$

wherein L represents the magnitude of the track inductance as seen by the capacitor 28 and C represents the magnitude of the capacitor 28. Moreover, since a train in the monitored track section 4 approaching the joints 3a, 3b is a traveling shunt that continues to eliminate inductance from the circuit resonant circuit as seen by the capacitor 28, the resonant frequency will be a dynamic one, varying in response to the approaching train until the train actually reaches the insulated joints 3a, 3b or, more precisely, the first tie points 13, 14 of the coupler 1 to the track 2.

Operation of the high pass coupler 1 now will be described with reference to the following example, wherein an approach 4 located between the tie point of a transmitter 6 to the track 2 at the beginning of the island 8 and the beginning of approach shunt 4a is 3000feet long and insulated joints 3a, 3b are connected in the track to isolate the left hand portion from the right-hand portion thereof at a distance of 500 feet from the island 8. Assuming that the normal track inductance is 1 mh per 1000 feet of track and that the turns ratio of the transformer 25, 26 is 20 to 1, the stepped up track inductance seen by the capacitor 28 when no train is in the monitored approach will be 1.2 h. Moreover, by selecting the capacitor 28 to be of a magnitude of say 10 microfarads, the resonant frequency of the coupler may be calculated according to the above equation to be 45.97 Hz.

Now, as a train enters the monitored approach 4 by crossing the beginning of approach shunt 4a and moves toward the insulated joints 3a, 3b, the track inductance in the approach as seen by the coupler and particularly the capacitor 28 therein will decrease, which causes an increase in the resonant frequency. Thus, just before the train arrives at the insulated joints 3a, 3b, or, more precisely, the first reached tie points 13, 14, the actual track inductance seen by the coupler 1 will have dropped to 0.5 mh, i.e. the track inductance of the 500 feet of the track between the transmitter 6 and the insulated joints 3a, 3b. Therefore, the stepped up track inductance seen by the capacitor 28 will be the square of the turns ratio of the transformer 25 times the actual track inductance, i.e. $(20/1)^2 \times 0.5$ mh or 0.2h; and, accordingly, the resonant frequency now will be 112.6 Hz.

Thus, as a train moves in from the beginning of approch shunt 4a toward the coupler 1, the resonant frequency changes from 45.97 Hz to 112.6 Hz, and if the detector system 5 is operating at a frequency of 150 Hz, thus approaches that operating frequency. This approach toward the resonant condition gives the overcoupling effect graphically illustrated, for example, in curve C of FIG. 2, and it is this resonant amplification of the track signal that results in the apparent shortening of the track length between the insulated joints 3a, 3b and the beginning of approach shunt 4a, as viewed from the island 8 by the detector system 5.

By introducing losses in the coupler 1 to reduce the Q thereof the resonant amplification also is reduced to the extent that the over-coupling effect is eliminated and the curve C of FIG. 2 becomes the same as the curve A representing an electrically continuous track.

Although the losses may be introduced at practically any place in the coupler 1, it is preferred to introduce those losses in the intermediate portion 17 by way of an added impedance 30, for example, in order to maintain the substantial symmetry of the coupler 1. The added impedance 30 may be a potentiometer 31 or other variable resistance connected by a further transformer 32 into the intermediate filtering portion 17 of the coupler 1. The transformer 32 may be similar to the transformers 25, 26 in having a low impedance 2 ohms winding 32a connected to the potentiometer and a high impedance 600 ohms winding 32b connected in the circuit loop with the capacitor 28 and transformer windings 25b, 26b with a 20 to 1 turns ratio between the high and low impedance windings thereof. While the potentiometer 31 may be connected directly in the mentioned circuit loop the use of the coupling transformer 32 increases the ruggedness of the coupler 1 by reducing the possibility of damage to the potentiometer 31 from the lightening-created voltage spokes or the like. Also, by coupling the potentiometer 31 into the high pass coupler 1 by the transformer 32, the size of the potentiometer may be reduced, for the effect thereof in the intermediate filtering portion 17 actually will be stepped up by the transformer 32.

Adjustment of the potentiometer 31 should be made so that the Q or resonant amplification of the high pass coupler 1 causes the curve of the lumped track impedance with respect to distance as viewed from the island 8 to as much as possible correspond to the curve A of FIG. 2. This adjustment can be made by temporarily short circuiting each of the insulated joints 3a, 3b and connecting a hard wire shunt across the rails 2a, 2b at various locations along the approach 4 from the beginning of approach shunt 4a to the island 8 while measuring and plotting for each location the $E_d$ voltage level developed in the receiver 7 with respect to distance from the island, so as to construct a smooth curve A, which is representative of the lumped track impedance with respect to distance as viewed from the island when the track is electrically continuous over the entire approach 4. Then, the insulated joints 3a, 3b may be reinserted in the electric circuit of the track by removing the shunts therearound and connecting the high pass coupler 1 to the track at or proximate to the insulated joints in the manner described above and shown, for example, in FIG. 1. Again, follow the shunting of the rails 2a, 2b, measuring and graphing method, as just described above, for various settings of the potentiometer 31 until there is obtained a smooth $E_d$ curve that fairly closely parallels the first obtained $E_d$ curve. When that appropriate setting of the potentiometer 31 is found, the high pass coupler 1 will be effective to bypass the insulated joints 3a, 3b so that to detector systems having operating frequencies above the highest resonant frequency of the high pass coupler the track over the entire monitored approach will appear electrically continuous. Although the variable resistance 31 is preferred for ease of adjustment, it will of course be appreciated that a fixed resistance may be substituted for the variable resistance 31 after completing the described adjustment to determine the desired magnitude of such fixed resistance, or even several different fixed resistances may be tried in place of the variable resistance 31 until a satisfactory adjustment is achieved.

By varying the size of the capacitor 28, the resonant frequency of the high pass coupler 1 can be correspondingly varied, and as one criterion for the invention it is normally necessary that the magnitude of the capacitor be chosen such that the highest resonant frequency of the coupler 1, i.e. when an approaching train is right next to the coupler tie points to the track, is below the operating frequency of the detector system 5 and the track signal transmitted and received thereby. Moreover, while the invention still may be operable if the high resonant frequency were to approximately equal the detector system operating frequency, this condition is undesirable since it is possible that the track inductance may vary with age, changing ballast conditions due, for example, to weather or the like, etc., and, therefore, preferably the size of the capacitor 2 is selected so that the highest resonant frequency of the coupler still will bebe reasonably lower than the detector system operating frequency, as in the above described example wherein the differential is on the order of 40 Hz. Clearly, however if the detector system operating frequency is relatively high, say 1000 Hz, by reducing the size of the capacitor 28, say down to approximately from 2 to 3 microfarads, the lowest resonant frequency in the example presented above will substantially exceed the 60 Hz level and, therefore, the capacitor 28 will assist the transformers 25, 26 in blocking 60 Hz signals while still effectively passing the relatively higher frequency track signal.

It also has been found that the high pass coupler 1 may be modified by removing the capacitor 28 from the intermediate portion 27 thereof and such modified coupler may be successfully used to bypass insulated joints located in an island such as the island 8 in FIG. 1. Such a modified high pass coupler then would provide the DC isolation and low frequency filtering function, respectively, by the coupling capacitors 21 through 24 and the low frequency cut-off point of the transformers 25, 26, while still providing effective coupling of the relatively higher operating frequency track signals of the detector system 5. During such usage of the high pass coupler in an island, the added impedance 30 may be used to add impedance between the transmitter 6 and the receiver 7 or the added impedance may be eliminated from the coupler, which would remain operational to bypass insulated joints in the island.

It will, of course, be appreciated that the values of magnitudes of inductance, capacitance and resistance presented above to facilitate description of the high pass coupler 1 of the invention and its operation to bypass insulated joints in a railroad track or other transmission medium for relatively high frequency signals, i.e. those signals above a predetermined cut-off frequency, are exemplary only and are offered simply to provide an understanding of the invention, which would be operable in the same manner when parameters of other magnitudes are encountered or selected.

It will now be understood that the high pass coupler of the invention provides a filtering effect so as to block transmission of DC signals and AC signals below the predetermined cut-off frequency while efficiently coupling relatively higher frequency AC signals around a set of insulated joints in a railroad track to bypass those joints so that to detector equipment or other equipment operating on those relatively higher frequency signals the railroad track will appear at least substantially electrically continuous.

The embodiments of the invention in which an exclusive property or privilege is claimed are defined as follows:

1. A bypass circuit for coupling AC signals around a set of insulated joints in a railroad track, comprising
   a high pass coupler provided with input and output coupling means for connecting the coupler to a track at opposite sides of insulated joints therein,
   means in said coupler between said input and output coupling means for resonating with the rack inductance to establish a resonant frequency for the coupler,
   such track inductance as seen by the coupler decreasing in magnitude in response to the moving shunt affect of a train approaching said coupling means and thus increasing such resonant frequency,
   said means for resonating being of a magnitude to assure that upon occurrence of such an approaching train such resonant frequency remains below the frequency of the AC signals to be coupled thereby, and
   means for effecting losses in the coupler such that the coupler and the track to which the coupler is connected present to the AC signals coupled around the insulated joints and to the electrical equipment operating on those AC signals an impedance characteristic substantially as though the track were electrically continuous.

2. A bypass circuit as set forth in claim 1, wherein said means for effecting losses comprises means for reducing the Q of the coupler.

3. A bypass circuit as set forth in claim 1, wherein said coupling means comprises capacitor means for isolating DC signals in the track rails.

4. A bypass circuit as set forth in claim 1, wherein said coupling means comprises means for blocking transmission of relatively low frequency signals below a predetermined cut-off frequency from passage through the circuit around the insulated joints.

5. A bypass circuit as set forth in claim 4, wherin said means for blocking comprises transformer means having a low frequency cut-off point for blocking signals having a frequency below such low frequency cut-off point.

6. A bypass circuit as set forth in claim 1, wherein said means for resonating comprises a capacitor.

7. A bypass circuit as set forth in claim 6, wherein said coupling means comprises first and second transformers, said first transformer having one winding for connection across the track rails on one side of the insulated joints and said second transformer having one winding for connection across the track rails on the other side of the insulated joints, and each transformer having another winding connection in a series circuit loop with said capacitor.

8. A bypass circuit as set forth in claim 7, wherein the turns ratio between the respective windings of each transformer is greater than unity so that each transformer provides a step up function in a direction from the track connection to the series circuit loop.

9. A bypass circuit as set forth in claim 8, wherein said coupling means further comprises capacitor means for isolating DC signals, and said transformers have a low frequency cut-off point above 60 Hz substantially to block 60 Hz signals from transmission through the coupler around the insulated joints.

10. A bypass circuit as set forth in claim 8, wherein said means for effecting losses comprises a varible resistance.

11. A bypass circuit as set forth in claim 10, wherein said means for effecting losses comprises transformer means for coupling said variable resistance in said series circuit loop.

12. A bypass circuit as set forth in claim 11, wherein said transformer means comprises first and second windings, the former being connected in series circuit with said variable resistance and the latter being connected in said series circuit loop, and said transformer means having a step up characteristic from said first to said second winding thereof.

13. A bypass circuit as set forth in claim 7, wheren said means for effecting losses comprises a variable resistance 14. A bypass circuit as set forth in claim 13, wherein said means for effecting losses comprises transformer means for coupling said variable resistance in said series circuit loop.

15. A bypass circuit as set forth in claim 14, wherein said transformer means comprises first and second windings, the former being connected in series circuit with said variable resistance and the latter being connected in said series circuit loop, and said transformer means having a step up characteristic from said first to said second winding thereof.

16. A coupler circuit for coupling AC signals around a set of insulated joints in a railroad track comprising coupling means for connecting the coupler to a track at opposite sides of the insulated joints, said coupling means including capacitor means for isolating DC signals in the rails of the track, and transformer filtering means having a low frequency cut-off point for coupling signals above such low frequency cut-off point around the insulated joints and for blocking pssage of signals below such low frequency cut-off point, said transformer filtering means comprising first and second transformers, each having a first winding connected in series with said capacitor means across the track rails on respective sides of the insulated joints and a second winding connected in a series circuit loop.

17. A coupler circuit as set forth in claim 16, further comprising means coupled in said series circuit loop for effecting losses therein.

18. A coupler circuit as set forth in claim 17, wherein said means for effecting losses comprises a variable resistance.

19. A coupler circuit as set forth in claim 18, wherein said means for effecting losses further comprises a transformer for inductively connecting said variable resistance in said series loop circuit.

20. A coupler circuit as set forth in claim 16, further comprising capacitor means in said series circuit loop for resonating with the track inductance to establish a resonant frequency for the coupler, said capacitor means being of a magnitude to assure that upon occurrence of a train approaching the coupler circuit the resonant frequency thereof remains below the frequency of the AC signals to be coupled by the coupler circuit.

* * * * *

UNITED STATES PATENT OFFICE
CERTIFICATE OF CORRECTION

PATENT NO. : 4,026,505
DATED : May 31, 1977
INVENTOR(S) : WILLARD L. GEIGER and JOHN D. WILLIAMS It is certified that error appears in the above-identified patent and that said Letters Patent are hereby corrected as shown below:

Column 10:

Claim 1, line 7 thereof, change "rack" to --track--.
Claim 5, line 1 thereof, change "wherin" to --wherein--.
Claim 7, line 8 thereof, change "connection" to --connected--.
Claim 10, line 2 thereof, change "varible" to --variable--.

Column 11:

Claim 13, line 1 thereof, change "wheren" to --wherein--.
Claim 13, line 3 thereof, add a period after "resistance".

Signed and Sealed this

Thirteenth Day of September 1977

[SEAL]

Attest:

RUTH C. MASON
Attesting Officer

LUTRELLE F. PARKER
Acting Commissioner of Patents and Trademarks